(12) United States Patent
Lin (10) Patent No.: US 11,942,943 B1
(45) Date of Patent: Mar. 26, 2024

(54) DUTY CYCLE ADJUSTMENT CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/938,360

(22) Filed: Oct. 6, 2022

(51) Int. Cl.
*H03K 7/08* (2006.01)
*H03K 3/017* (2006.01)
*H03K 17/687* (2006.01)
*H03K 17/693* (2006.01)
*H03K 19/20* (2006.01)
*H03M 7/16* (2006.01)

(52) U.S. Cl.
CPC ............ *H03K 3/017* (2013.01); *H03K 7/08* (2013.01); *H03K 17/6872* (2013.01); *H03K 17/693* (2013.01); *H03K 19/20* (2013.01); *H03M 7/165* (2013.01)

(58) Field of Classification Search
CPC ............ H03K 3/017; H03K 7/08; H03K 9/08; H03K 19/20; H03K 17/6872; H03K 17/693; H03M 7/165; G06F 1/04
See application file for complete search history.

(56) References Cited

U.S. PATENT DOCUMENTS

| 7,913,199 | B2 | 3/2011 | Boerstler et al. | |
| 11,005,467 | B1 * | 5/2021 | Lin | H03K 3/017 |
| 11,424,736 | B1 * | 8/2022 | Bowman | H03K 3/017 |

* cited by examiner

*Primary Examiner* — Long Nguyen
(74) *Attorney, Agent, or Firm* — McClure, Qualey & Rodack, LLP (57) ABSTRACT

A method of duty cycle adjustment includes conditionally inverting an input clock into a conditionally inverted clock; and adjusting a duty cycle of the conditionally inverted clock in one direction in accordance with an integer that represents an amount of duty cycle adjustment, using an uneven clock buffer and a plurality of uneven clock multiplexers that are cascaded and incrementally activated as a value of the integer increments.

19 Claims, 6 Drawing Sheets

DUTY CYCLE ADJUSTMENT CIRCUIT AND METHOD THEREOF

BACKGROUND OF THE DISCLOSURE

Field of the Disclosure

The present disclosure generally relates to duty cycle adjustment, and more particularly to a duty-cycle adjustment circuits having improved power and noise performance.

Description of Related Art

Figure 1A:
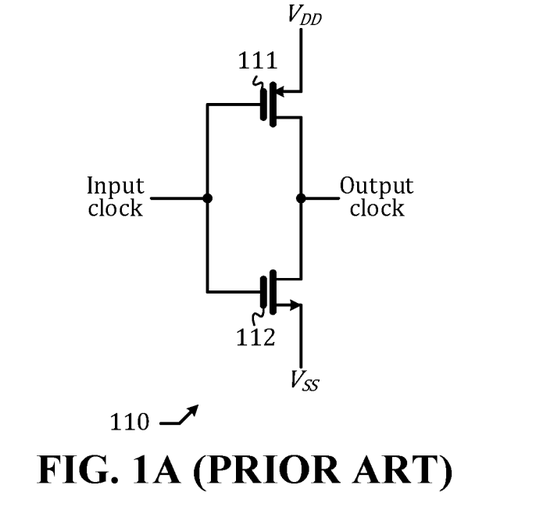
FIG. 1A shows a schematic diagram of an inverter.

Many modern electronic circuits require a precise clock for proper operation. A clock is a voltage signal that periodically toggles back and forth between a low level and a high level. A percentage of time that the voltage signal stays in the high level is called a duty cycle. Many circuits require a specific duty cycle for a clock to provide an optimal performance. For instance, in a multi-phase clock system wherein both a rising edge and a falling edge of a clock are used, a 50% duty cycle is usually desired. However, an actual duty cycle of a clock may deviate from a desired value. A duty-cycle adjustment circuit is often used to make a clock have approximately a desired duty cycle. As depicted in FIG. 1A, a prior art duty-cycle adjustment circuit relies on using an inverter 100, which comprises a PMOS (p-channel metal oxide semiconductor) transistor 111 and a NMOS (n-channel metal oxide semiconductor) transistor 112, as a clock buffer configured receive an input clock and output an output clock. Throughout this disclosure, "$V_{DD}$" denotes a power supply node, and "$V_{SS}$" denotes a ground node. A high-to-low transition of the input clock leads to a low-to-high transition of the output clock with a delay depending on a strength of a pull-up provided by the PMOS transistor 111, while a low-to-high transition of the input clock leads to a high-to-low transition of the output clock with a delay depending on a strength of a pull-down provided by the NMOS transistor 112. When the strength of the pull-up and the strength of the pull-down are equal, there is no difference in the delay of the respective transition, and the duty cycle of the output clock is approximately a complement of the duty cycle of the input clock. For instance, if the duty cycle of the input clock is 45%, the duty cycle of the output clock will be 55%. When the strength of the pull-up is greater (smaller) than the strength of the pull-down, the output clock makes a low-to-high transition faster (slower) than a high-to-low transition, causing the output clock to stay in the high level longer (shorter) and thus have a larger (smaller) duty cycle. Adjusting a relative strength between the pull-up and the pull-down of the inverter thus can adjust a duty cycle of the output clock. A strength of a MOS transistor depends on a width to length ratio of said MOS transistor; a higher width-to-length ratio of the PMOS transistor 111 (NMOS transistor 112) allows a strength of a pull-up (pull-down) provided by the PMOS transistor 111 (NMOS transistor 112) to be greater (smaller). By making a width of the PMOS transistor 111 (NMOS transistor 112) adjustable, one can adjust a strength of the pull-up (pull-down) and thus adjust a duty cycle of the output clock.

A drawback of using inverter 110 as a clock buffer and adjusting a width of a MOS transistor therein to adjust a duty cycle is that the MOS transistor is a major noise contributor. In particular, the MOS transistor contributes a low-frequency noise known as "flicker noise" that is detrimental in many applications. Besides, inverter 110 is sensitive to a noise in either the power supply node $V_{DD}$ or the ground node $V_{SS}$; any noise at the power supply node $V_{DD}$ or the ground node $V_{SS}$ can modulate a duty cycle of the output clock.

Figure 1B:
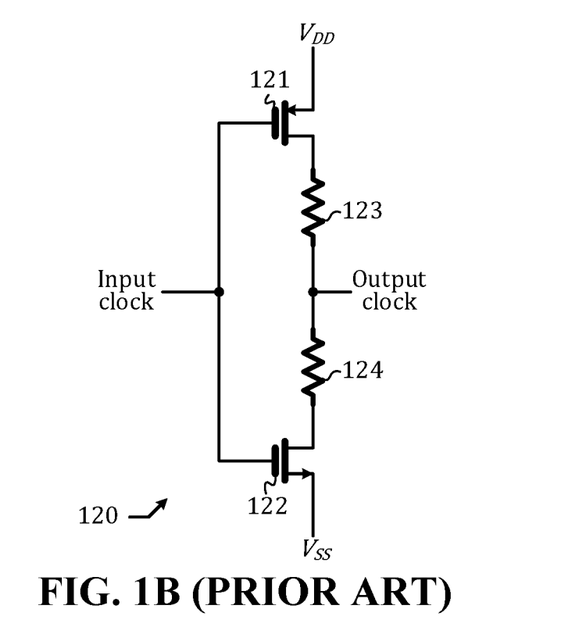
FIG. 1B shows a schematic diagram of a prior art duty-cycle adjustment circuit.

In U.S. Pat. No. 7,913,199, Boerstler et al disclosed a duty-cycle adjustment circuit that relies on using a PMOS (NMOS) transistor in series with a resistor to determine a strength of a pull-up (pull-down), and adjust a duty cycle of the output clock by adjusting a resistance of the resistor. As depicted in FIG. 1B, a duty-cycle adjustment circuit 120 comprises a PMOS transistor 121, a NMOS transistor 122, a first resistor 123, and a second resistor 124. PMOS transistor 121 along with the first resistor 123 jointly determine a strength of a pull-up of the output clock, while NMOS transistor 122 and the second resistor 124 jointly determine a strength of a pull-down of the output clock. A duty cycle of the output clock can be adjusted by adjusting a resistance of either the first resistor 123 or the second resistor 124 and thus adjusting a relative strength of the pull-up with respect to the pull-down. However, the main objective of Boerstler et al is to reduce a PVT (process, voltage, temperature) variation, while the effect of noise is not considered. Therefore, Boerstler et al taught people to choose a resistance value of the first (second) resistor 123 (124) to be less than approximately a tenth of a resistance value of the PMOS transistor 121 (NMOS transistor 122); in doing so, a noise generated by PMOS transistor 121 (NMOS transistor 122) is greater than a noise generated by the first (second) resistor 123 (124) and an issue of a flicker noise generated by the PMOS transistor 121 or the NMOS transistor 122 is not addressed. Besides, a noise at the power supply node $V_{DD}$ or the ground node $V_{SS}$ that can modulate a duty cycle of the output clock is not considered.

In U.S. Pat. No. 11,005,467, Lin disclosed a duty-cycle adjustment circuit that can effectively alleviate a flicker noise and a noise in the power supply or ground.

In both U.S. Pat. Nos. 7,913,199 and 11,005,467, a duty cycle is adjusted by adjusting a relative strength between a pull-up and a pull-down of an adjustable inverter, and the duty cycle can be either increased or decreased in accordance with a control signal. Besides, to achieve a wider range of adjustment, a plurality of adjustable inverters is cascaded. There are two drawbacks. First, an adjustable inverter has an overhead in providing the adjustability and it inevitably leads to an inferior figure of merit (in power consumption and layout area in an integrated circuit embodiment of interest). Second, an input clock needs to propagate along said cascaded adjustable inverters even when the input clock already has a desirable duty cycle, leading to unnecessary waste of power and accumulation of circuit noises.

What is desired is a duty-cycle adjustment circuit that does not rely on using adjustable inverter and can avoid waste of power and addition of circuit noise.

BRIEF DESCRIPTION OF THIS DISCLOSURE

One objective of this present disclosure is to utilize a one-directional duty adjustment circuit along with an upfront conditional inversion to provide two-directional duty adjustment for a clock, thus avoiding an overhead in an outright two-directional duty adjustment circuit.

Another objective of this present disclosure is to incrementally activate a part of a duty adjustment circuit to incrementally adjust a duty cycle of a clock, thus activating circuits as needed and avoiding waste of power and addition of circuit noise.

In an embodiment, a duty adjustment circuit comprises a conditional inversion circuit configured to receive an input clock and output a conditionally inverted clock in accordance with an inversion enable signal; and a one-directional duty adjustment circuit comprising an uneven clock buffer and an uneven clock multiplexer (UCM) chain comprising NUCMs, where N is an integer greater than 1, that are cascaded and controlled by a N-bit control code, wherein each of said N UCMs receives a respective first input from either the conditional inversion circuit or a respective preceding UCM, and a respective second input from either a respective succeeding UCM or the uneven clock buffer, and outputs a respective first output to either a respective succeeding UCM or the uneven clock buffer, and a respective second output either as an output clock or to a respective preceding UCM, in accordance with a respective bit of the N-bit control code.

In an embodiment, a method of duty cycle adjustment comprises: conditionally inverting an input clock into a conditionally inverted clock; and adjusting a duty cycle of the conditionally inverted clock in one direction in accordance with an integer that represents an amount of duty cycle adjustment, using an uneven clock buffer and a plurality of uneven clock multiplexers that are cascaded and incrementally activated as a value of the integer increments.

DETAILED DESCRIPTION OF THIS DISCLOSURE

The present disclosure is directed to duty cycle adjustment. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "inverter," "multiplexer," and "NAND gate." Terms like these are used in a context of microelectronics, and the associated concepts are apparent to those of ordinary skills in the art and thus will not be explained in detail here.

Those of ordinary skill in the art can recognize a resistor symbol and can recognize a MOS (metal-oxide semiconductor) transistor symbol, for both PMOS transistor and NMOS transistor. Those of ordinary skill in the art can read schematics of a circuit comprising resistors, NMOS transistors, and PMOS transistors, and do not need a verbose description about how one transistor or resistor connects with another in the schematics.

This present disclosure is disclosed in terms of an engineering sense. For instance, regarding two variables X and Y, when it is said that "X is equal to Y," it means that "X is approximately equal to Y," i.e. "a difference between X and Y is smaller than a specified engineering tolerance." When it is said that "X is zero," it means that "X is approximately zero," i.e. "X is smaller than a specified engineering tolerance." When it is said that "X is substantially smaller than Y," it means that "X is negligible with respect to Y," i.e. "a ratio between X and Y is smaller than an engineering tolerance and therefore X is negligible when compared to Y."

Throughout this disclosure, "$V_{DD}$" denotes a power supply node, and "$V_{SS}$" denotes a ground node. Note that a ground node is a node at which a voltage level is substantially zero, and a power supply node is a node at which a voltage level is substantially stationary and higher than zero.

In this present disclosure, a signal is a voltage of a variable level that can vary with time. A (voltage) level of a signal at a moment represents a state of the signal at that moment.

A logical signal is a signal of two states: a low state and a high state. The low state is also referred to as a "0" state, while the high stage is also referred to as a "1" state. Regarding a logical signal Q, "Q is high" or "Q is low," means "Q is in the high state" or "Q is in the low state." Likewise, "Q is 1" or "Q is 0," means "Q is in the 1 state" or "Q is in the 0 state."

When a logical signal toggles from low to high, it undergoes a low-to-high transition. When a logical signal toggles from high to low, it undergoes a high-to-low transition.

A first logical signal is said to be a logical inversion of a second logical signal, if the first logical signal and the second logical signal are always in opposite states. That is, when the first logical signal is 0 (or low), the second logical signal is 1 (or high); when the first logical signal is 1 (or high), the second logical signal is 0 (high).

A clock is a logical signal that cyclically toggles back and forth between a low state and a high state. A duty cycle of the clock is a percentage of time that the clock stays in the high state. In this disclosure, "duty cycle" may sometimes be simply referred to as "duty" for short.

If a first clock is a logical inversion of a second clock, a sum of a duty cycle of the first clock and a duty cycle of the second clock will be equal to 100%. If the duty cycle of the first clock is above (below) 50%, the duty cycle of the second clock must be below (above) 50%; an enlargement of the duty cycle of the first clock is accompanied by a reduction of the duty cycle of the second clock, and vice versa.

A rising edge refers to an event where the clock toggles from the low state to the high stage. A falling edge refers to an event that the clock toggles from the high state to the low state.

A circuit is a collection of a transistor, a resistor, and/or other electronic devices inter-connected in a certain manner to embody a certain function.

An inverter is a circuit configured to receive a first logical signal and output a second logical signal that is a logical inversion of the first logical signal. An inverter comprises a pull-up circuit that usually comprises a PMOS transistor and a pull-down circuit that usually comprises a NMOS transistor. A high-to-low transition of the first logical signal activates the pull-up circuit to pull up the second logical signal to a voltage level of a power supply node, resulting in a low-to-high transition of the second logical signal. A low-to-high transition of the first logical signal activates the pull-down circuit to pull down the second logical signal to a voltage level of a ground node, resulting in a high-to-low transition of the second logical signal. A resistance of the pull-up circuit is referred to as a pull-up resistance. A resistance of the pull-down circuit is referred to as a pull-down resistance. A time that the second logical signal takes to complete a low-to-high transition depends on the pull-up resistance, while a time that the second logical signal takes to complete a high-to-low transition depends on the pull-down resistance. Consider a case where the first logical signal is a first clock and the second logical signal is a second clock. When the pull-up resistance is larger (smaller) than the pull-down resistance, it is said that a pull-up is weaker (stronger) than a pull-down, an incidentally it has an effect of reducing (enlarging) a duty cycle of the second clock. Since the second clock is an inversion of the first clock, the effect of reducing (enlarging) the duty cycle of the second clock is functionally equivalent to enlarging (reducing) the duty cycle of the first clock.

A multiplexer receives a first input signal and a second input signal and outputs an output signal in accordance with a control signal, which is a logical signal; the output signal is equal to the first input signal if the control signal is 0, and equal to the second input signal if the control signal is 1. When the control signal is 0, the second input signal is irrelevant; when the control signal is 1, the first input signal is irrelevant.

A NAND gate receives a first input signal and a second input signal and outputs an output signal, wherein the first input signal, the second input signal, and the output signal are all logical signals. The output signal is 0 if both the first input signal and the second input signal are 1, otherwise, the output signal is 1. If one of the first input signal and the second input signal is always 1 for a long duration of time of interest, the NAND gate effectively becomes an inverter that inverts the other input signal into the output signal. If one of the first input signal and the second input signal is always 0 for a very long duration of time of interest, then the output signal is always 1 (or is 1 for a long duration of time of interest) and does not respond to a change of the other input signal, which becomes irrelevant.

Figure 2:
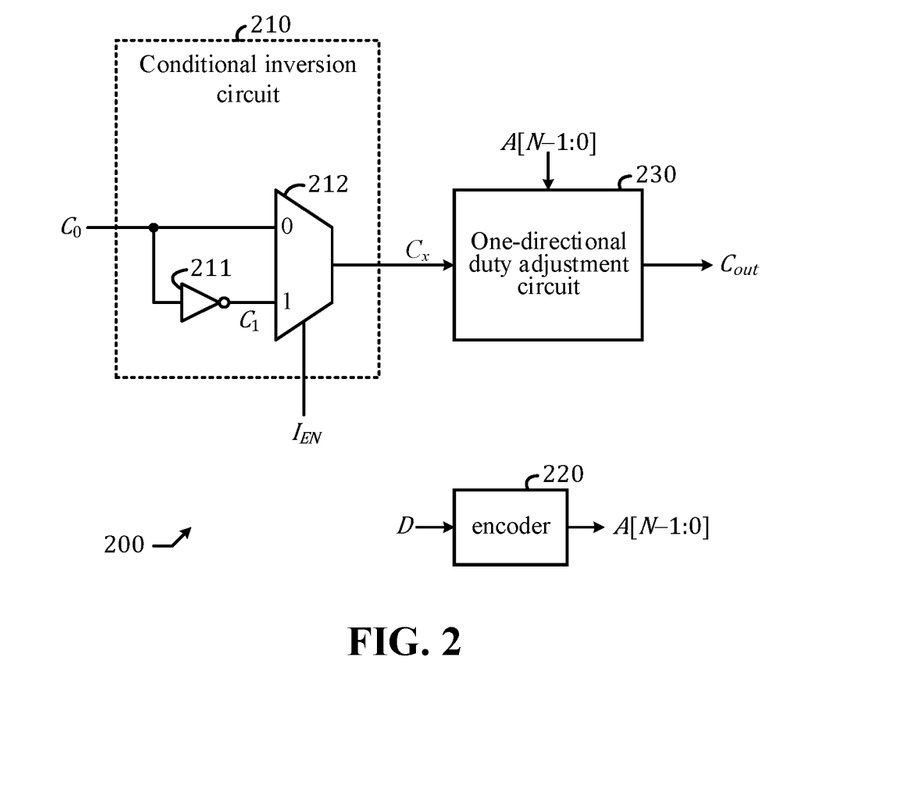
FIG. 2 shows a schematic diagram of a duty-cycle adjustment circuit in accordance with an embodiment of the present disclosure.

A schematic diagram of a duty-cycle adjustment circuit 200 in accordance with an embodiment of the present disclosure is depicted in FIG. 2. Duty-cycle adjustment circuit 200 comprises: a conditional inversion circuit 210 configured to receive an input clock $C_0$ and output a conditionally inverted clock $C_x$ in accordance with an inversion enable signal $I_{EN}$; and a one-directional duty adjustment circuit 230 configured to receive the conditionally inverted clock $C_x$ and output an output clock $C_{out}$ in accordance with a N-bit control code A[N−1:0], where N is an integer greater than 1. In a first embodiment, the one-directional duty adjustment circuit 230 is a duty enlarging circuit; in this case, a duty cycle of $C_{out}$ is always larger than a duty cycle of $C_x$ regardless of a value of A[N−1:0]. In a second embodiment, the one-directional duty adjustment circuit 230 is a duty reducing circuit; in this case, the duty cycle of $C_{out}$ is always smaller than the duty cycle of $C_x$ regardless of a value of A[N−1:0]. In an embodiment, the duty-cycle adjustment circuit 200 further comprises an encoder 220 configured to encode an integer D into A[N−1:0], wherein D represents an amount of duty cycle adjustment and is not smaller than 0 but not greater than N. By way of example but not limitation, N is 4 and encoder 220 is a thermometer code encoder that encodes D into A[3:0] in accordance with the table below:

| D | A[0] | A[1] | A[2] | A[3] |
|---|------|------|------|------|
| 0 | 0 | 0 | 0 | 0 |
| 1 | 1 | 0 | 0 | 0 |
| 2 | 1 | 1 | 0 | 0 |
| 3 | 1 | 1 | 1 | 0 |
| 4 | 1 | 1 | 1 | 1 |

Conditional inversion circuit 210 comprises an inverter 211 configured to receive $C_0$ and output and inverted clock $C_1$, and a multiplexer 212 configured to select one of $C_0$ and $C_1$ to be $C_x$ in accordance with $I_{EN}$. When $I_{EN}$ is 0, $C_0$ is selected; when $I_{EN}$ is 1, $C_1$ is selected. $C_1$ is a logical inversion of $C_0$, therefore a sum of a duty cycle of $C_0$ and a duty cycle of $C_1$ is 100%. If the duty cycle of $C_0$ is above (below) 50%, the duty cycle of $C_1$ must be below (above) 50%; an enlargement of the duty cycle of $C_0$ is functionally equivalent to a reduction of the duty cycle of $C_1$, and vice versa. When $I_{EN}$ is 0 (1), $C_0$ ($C_1$) is selected as $C_x$, enlarging the duty cycle of $C_x$ is functionally equivalent to enlarging the duty cycle of $C_0(C_1)$ and reducing the duty cycle of $C_1$ ($C_0$). In the first embodiment where the one-directional duty adjustment circuit 230 is a duty enlarging circuit, the duty cycle of $C_{out}$ will always be greater than the duty cycle of $C_x$ and thus greater (smaller) than the duty cycle $C_0$ if $I_{EN}$ is 0 (1). In the second embodiment where the duty adjustment circuit is a duty reducing circuit, the duty cycle of $C_{out}$ will always be smaller than the duty cycle of $C_x$ and thus greater (smaller) than the duty cycle of $C_0$ if $I_{EN}$ is 1 (0). Therefore, in both the first embodiment and the second embodiment, the duty cycle of $C_{out}$ can be made either larger or smaller than the duty cycle of $C_0$, albert using a one-directional duty adjustment circuit 230 that can adjust duty cycle only in one direction, be it larger or smaller.

A one-directional duty adjustment circuit just needs to adjust the duty in one direction, enlarging or reducing, can eliminate the overhead in incorporating the circuitry needed to adjust the duty in the opposite direction, and thus can have a superior design efficiency and figure of merit. In case an adjustment in the opposite direction is needed, it can be accomplished by enabling the clock inversion function of the conditional inversion circuit 210, i.e., setting $I_{EN}$ to 1.

Figure 3A:
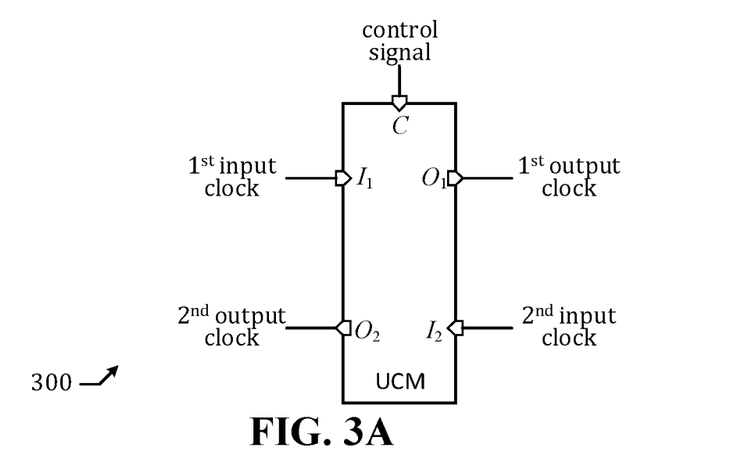
FIG. 3A shows a schematic symbol of an uneven clock multiplexer (UCM) in accordance with an embodiment of the present disclosure.
Figure 3B:
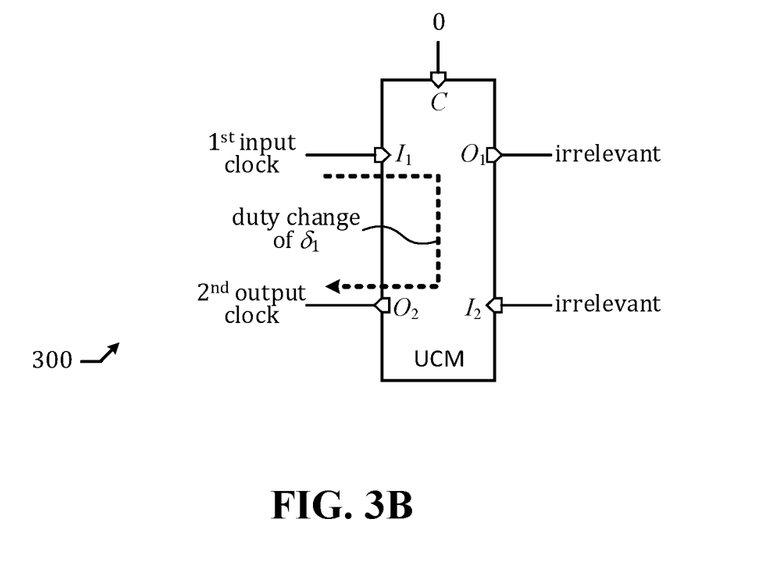
FIG. 3B illustrates a signal flow of the UCM of FIG. 3A when its control signal is 0.
Figure 3C:
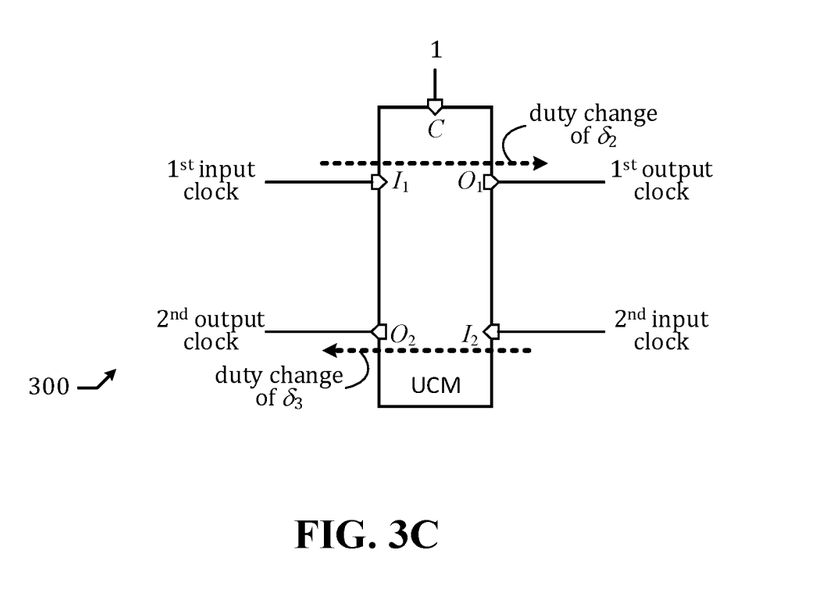
FIG. 3C illustrates a signal flow of the UCM of FIG. 3A when its control signal is 1.

The one-directional duty adjustment circuit 230 is based on instantiating an uneven clock multiplexer (UCM) 300 that, as shown in FIG. 3A, receives a first input clock from a first input pin "$I_1$" and a second input clock from a second input pin "$I_2$" and outputs a first output clock via a first output pin "$O_1$" and a second output clock via a second output pin "$O_2$" in accordance with a control signal provided at a control pin "C"; when the control signal is 0 and incidentally the second input clock is irrelevant (and will be explained later), as shown in FIG. 3B, the first output clock is irrelevant (and will be explained later), and the first input clock propagates into the second output clock with a change of duty cycle of $\delta_1$; and when the control signal is 1, as shown in FIG. 3C, the first input clock propagates into the first output clock with a change of duty cycle of $\delta_2$, and the second input clock propagates into the second output clock with a change of duty cycle of $\delta_3$. The uneven clock multiplexer 300 is said to be uneven, because for the first output clock and/or the second output clock, a pull-up and a pull-down are of different strengths, resulting in a change of duty cycle of the first output clock and/or the second output clock.

Figure 4:
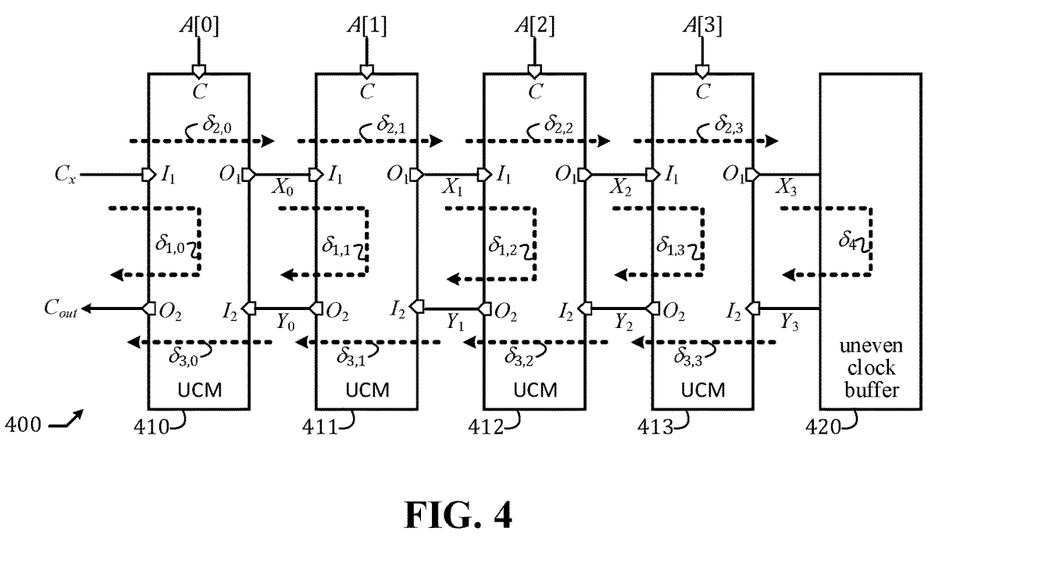
FIG. 4 shows a schematic diagram of a one-directional duty adjustment circuit that can be used in the duty-cycle adjustment circuit of FIG. 2 in accordance with an embodiment of the present disclosure.

A schematic of a one-directional duty adjustment circuit 400 that can be used to embody the one-directional duty adjustment circuit 230 of FIG. 2 is shown in FIG. 4. One-directional duty adjustment circuit 400 comprises: an uneven clock multiplexer (UCM) chain comprising four UCMs 410, 411, 412, and 413, that are cascaded; and an uneven clock buffer 420. UCM 410 (411, 412, 413) receives $C_x$ ($X_0$, $X_1$, $X_2$) and $Y_0$($Y_1$, $Y_2$, $Y_3$) via its "$I_1$" pin and "$I_2$" pin, respectively, outputs $X_0$($X_1$, $X_2$, $X_3$) and $C_{out}$ ($Y_0$, $Y_1$, $Y_2$) via its "$O_1$" pin and "$O_2$" pin, respectively, in accordance with a control of A[0] (A[1], A[2], A[3]) provided at its "C" pin. When A[0] (A[1], A[2], A[3]) is 0, $C_x$ ($X_0$, $X_1$, $X_2$) propagates into $C_{out}$($Y_0$, $Y_1$, $Y_2$) with a duty cycle change of $\delta_{1,0}$ ($\delta_{1,1}$, $\delta_{1,2}$, $\delta_{1,3}$). When A[0] (A[1], A[2], A[3]) is 1, $C_x$ ($X_0$, $X_1$, $X_2$) propagates into $X_0$($X_1$, $X_2$, $X_3$) with a duty cycle change of $\delta_{2,0}$ ($\delta_{2,1}$, $\delta_{2,2}$, $\delta_{2,3}$) while $Y_0$($Y_1$, $Y_2$, $Y_3$) propagates into $C_{out}$($Y_0$, $Y_1$, $Y_2$) with a duty cycle change of $\delta_{3,0}$ ($\delta_{3,1}$, $\delta_{3,2}$, $\delta_{3,3}$). The uneven clock buffer 420 receives $X_3$ and output $Y_3$ so that $X_3$ propagates into $Y_3$ with a duty cycle change of $\delta_4$.

When D=0 and A[3:0]=0000, $C_x$ propagates into $C_{out}$ through UCM 410 with a duty cycle change of $\delta_{1,0}$. In this case, $X_0$ and $Y_0$ are irrelevant (because they do not react to a toggle of $C_x$ and do not affect $C_{out}$), and UCM 411, UCM 412, UCM 413, and the uneven clock buffer 420 are de facto deactivated.

When D=1 and A [3:0]=0001, $C_x$ propagates into $C_{out}$ through UCM 410 and UCM 411 with a duty cycle change of $\delta_{2,0}+\delta_{1,1}+\delta_{3,0}$. In this case, $X_1$ and $Y_1$ are irrelevant (because they do not react to a toggle of $C_x$ and do not affect $C_{out}$), and UCM 412, UCM 413, and the uneven clock buffer 420 are de facto deactivated.

When D=2 and A [3:0]=0011, $C_x$ propagates into $C_{out}$ through UCM 410, UCM 411, and UCM 412 with a duty cycle change of $\delta_{2,0}+\delta_{2,1}+\delta_{1,2}+\delta_{3,1}+\delta_{3,0}$. In this case, $X_2$ and $Y_2$ are irrelevant (because they do not react to a toggle of $C_x$ and do not affect $C_{out}$), and UCM 413 and the uneven clock buffer 420 are de facto deactivated.

When D=3 and A[3:0]=0111, $C_x$ propagates into $C_{out}$ through UCM 410, UCM 411, UCM 412, and UCM 413 with a duty cycle change of $\delta_{2,0}+\delta_{2,1}+\delta_{2,2}+\delta_{1,3}+\delta_{3,2}+\delta_{3,1}+\delta_{3,0}$. In this case, $X_3$ and $Y_3$ are irrelevant (because they do not react to a toggle of $C_x$ and do not affect $C_{out}$), and the uneven clock buffer 420 is de facto deactivated.

When D=4 and A [3:0]=1111, $C_x$ propagates into $C_{out}$ through UCM 410, UCM 411, UCM 412, UCM 413, and the uneven clock buffer 420 with a duty cycle change of $\delta_{2,0}+\delta_{2,1}+\delta_{2,2}+\delta_{2,3}+\delta_4+\delta_{3,3}+\delta_{3,2}+\delta_{3,1}+\delta_{3,0}$.

As the value of integer D increments by 1, an additional UCM or the uneven clock buffer 420 is activated, causing the output clock $C_{out}$ to have an additional change in duty cycle.

Figure 5:
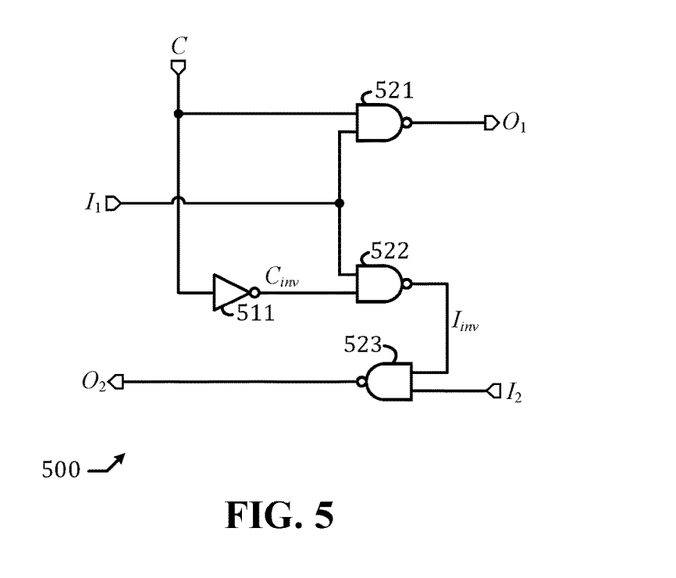
FIG. 5 shows a schematic diagram of a UCM that can be instantiated and used in the one-directional duty adjustment circuit of FIG. 4.

A schematic diagram of an UCM 500 that can be used to embody UCM 410, 411, 412, and 413 of FIG. 4 is shown in FIG. 5. The UCM 500 comprises an inverter 511 and three NAND gates 521, 522, and 523. For brevity, hereafter the first input clock at the first input pin "$I_1$" is simply referred to as $I_1$, the second input clock at the second input pin "$I_2$" is simply referred to as 12, the first output clock at the first output pin "$O_1$" is simply referred to as $O_1$, the second output clock at the second output pin "$O_2$" is simply referred to as $O_2$, and the control signal at the control pin "C" is simply referred to as C. Inverter 511 receives C and outputs an inverted control signal $C_{inv}$. NAND gate 521 receives C and 1 and outputs $O_1$. NAND gate 522 receives $I_1$ and $C_{inv}$ and outputs an inverted input clock $I_{inv}$. NAND gate 523 receives $I_{inv}$ and $I_2$ and outputs $O_2$.

When C pin is 1, $C_{inv}$ is 0, $I_{inv}$ is 1, $O_1$ is an inversion of h, and $O_2$ is an inversion of $I_2$. However, a duty cycle of $O_1$ can be different from a duty cycle of $I_1$ and it depends on the circuit implementation of NAND gate 521. Likewise, a duty cycle of $O_2$ can be different from a duty cycle of $I_2$ and it depends on the circuit implementation of NAND gate 523.

When C is 0, $O_1$ and $C_{inv}$ are both 1, and $I_{inv}$ is an inversion of h. In a case where UCM 500 is instantiated to embody UCM 413, $O_1$ will propagate into $I_2$ through the uneven clock buffer 420, and thus $I_2$ will be 1. In a case where UCM 500 to embody UCM 412, $O_1$ will propagate into $I_2$ through UCM 413 and the uneven clock buffer 420 and thus $I_2$ will be 1. In a case where UCM 500 is instantiated to embody UCM 411, $O_1$ will propagate into $I_2$ through UCM 412, UCM 413, and the uneven clock buffer 420 and thus $I_2$ will be 1. In a case where UCM 500 is instantiated to embody UCM 410, $O_1$ will propagate into $I_2$ through UCM 411, UCM 412, UCM 413, and the uneven clock buffer 420 and thus $I_2$ will be 1. Therefore, in any case, $O_1$ will always propagate into $I_2$ and thus $I_2$ will always be 1, and $O_2$ will always be an inversion of $I_{inv}$, and thus the same as $I_1$. That's why, earlier in this disclosure, it is said that when C is 0, $I_1$ will propagate into $O_2$, while $O_1$ and $I_2$ become irrelevant (see FIG. 3B). However, a duty cycle of $O_2$ can be different from a duty cycle of $I_1$ and it depends on the circuit implementation of NAND gates 522 and 523.

Figure 6:
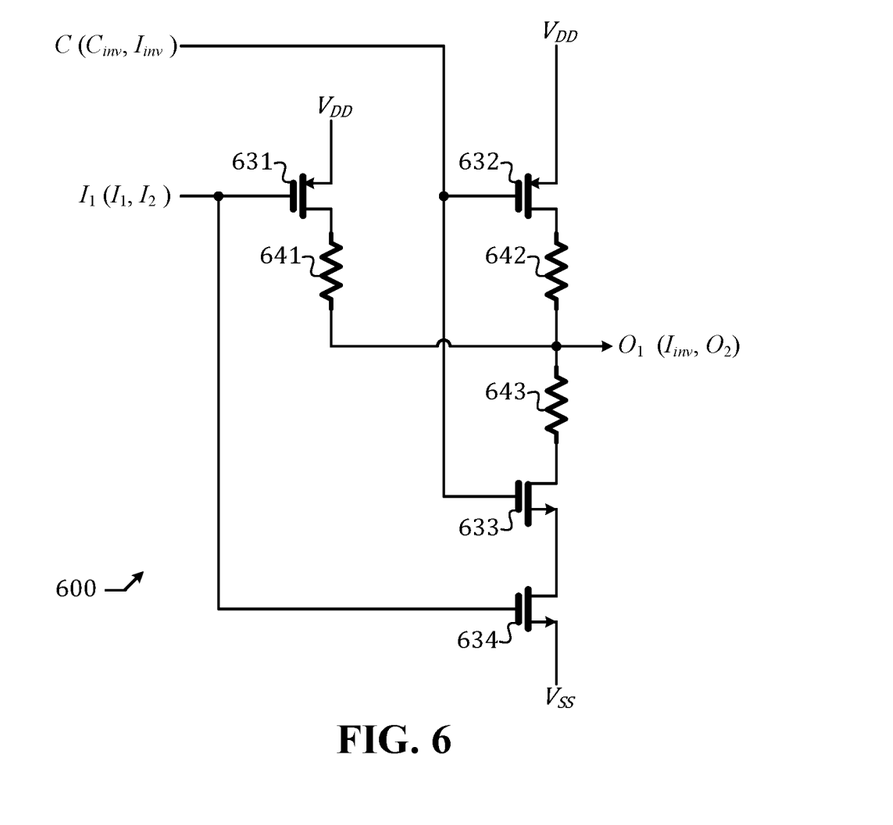
FIG. 6 shows a schematic diagram of a NAND gate that can be used in the UCM of FIG. 5.

A schematic diagram of a NAND gate 600 that can be instantiated to embody NAND gates 521 (522, 523) is shown in FIG. 6. NAND gate comprises two PMOS transistors 631 and 632, two NMOS transistors 633 and 634, and three optional resistors 641, 642, and 643. Except for the three optional resistors, NAND gate 600 is a circuit well known in the prior art and thus not be described in detailed. A purpose of using the three optional resistors will be explained shortly.

Consider the case where the NAND gate 600 is used to embody NAND gate 521. If a desired duty cycle change requires $O_1$ to have a pull-up weaker than a pull-down in response to a toggle of $I_1$: resistor 641 is useful and can be incorporated; resistor 643 is detrimental and should be avoided (i.e., should be replaced by a short circuit); and resistor 642 is unnecessary. If a desired duty cycle change requires $O_1$ to have a pull-down weaker than a pull-up in response to a toggle of $I_1$: resistor 643 is useful and can be incorporated; resistor 641 is detrimental and should be avoided (i.e., should be replaced by a short circuit); and resistor 642 is unnecessary.

Consider the case where the NAND gate 600 is used to embody NAND gate 522. If a desired duty cycle change requires $I_{inv}$ to have a pull-up weaker than a pull-down in response to a toggle of $I_1$: resistor 641 is useful and can be incorporated; resistor 643 is detrimental and should be avoided (i.e., should be replaced by a short circuit); and resistor 642 is unnecessary. If a desired duty cycle change requires $I_{inv}$ to have a pull-down weaker than a pull-up in response to a toggle of $I_1$: resistor 643 is useful and can be incorporated; resistor 641 is detrimental and should be avoided (i.e., should be replaced by a short circuit); and resistor 642 is unnecessary.

Consider the case where the NAND gate 600 is used to embody NAND gate 523. If a desired duty cycle change requires $O_2$ to have a pull-up weaker than a pull-down in response to either a toggle of $I_2$ or a toggle of $I_{inv}$: resistors 641 and 642 are useful and can be incorporated; and resistor 643 is detrimental and should be avoided (i.e., should be replaced by a short circuit). If a desired duty cycle change requires $O_2$ to have a pull-down weaker than a pull-up in response to either a toggle of $I_2$ or a toggle of $I_{inv}$: resistor 643 is useful and can be incorporated, while resistors 641 and 642 are detrimental (and should be replaced by a short circuit).

For NAND gate 600, however, one can choose not to incorporate resistors 641, 642, or 643, but instead resort to using proper width/length ratios to make PMOS transistors 631 and/or 632 intentionally have a pull-up strength that is either greater than or smaller than a pull-down strength of NMOS transistors 633 and/or 634. This approach, however, leads to a higher flicker noise, and thus may not be favorable.

Note that, for a clock, once inverted, the roles of pull-up and pull-down are swapped. So, although an original clock needs a weaker pull-down than a pull-up to have a larger duty cycle, an inversion of the original clock will need a weaker pull-up than a pull-down to have a larger duty cycle, if we refer to the equivalent duty cycle of the original clock. In the one-directional duty adjustment circuit 400, if UCM 500 of FIG. 5 is used to embody UCM 410, 411, 412, and 413, an objective of effectively having a larger duty cycle of $C_x$ will demand a pull-up weaker than a pull-down for $X_0$, $X_2$, $Y_0$ and $Y_2$, but a pull-down weaker than a pull-up for $X_1$, $X_3$, $Y_1$ and $Y_3$, due to an inverting nature of a propagation from $I_1$ to $O_1$ and from $I_2$ to $O_2$ of UCM 500. Since there are numerous modifications and alterations that are possible, it'll be futile to exhaustively list all possibilities, as simply adding an extra inverter would swap the roles of pull-up and pull-down, and thus the appended claims will focus on an underlying principle without attempting to specify whether a pull-up is stronger than a pull-down.

Figure 7:
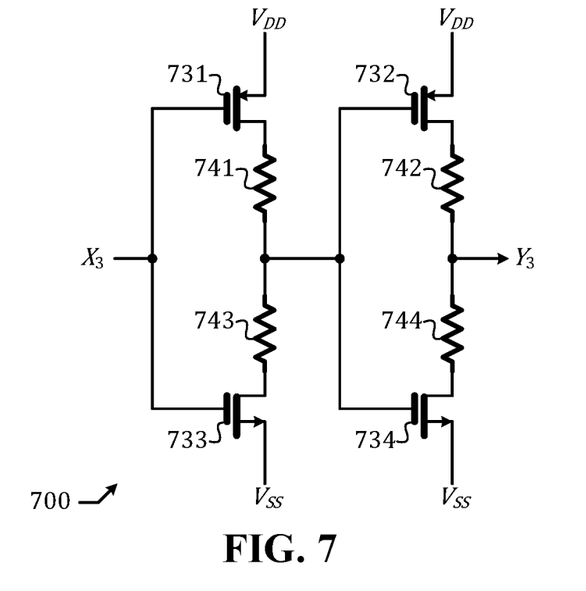
FIG. 7 shows a schematic diagram of an uneven clock buffer that can be used in the one-directional duty adjustment circuit of FIG. 4.

An uneven clock buffer 700 that can be used to embody the uneven clock buffer 420 of FIG. 4 is shown in FIG. 7. The uneven clock buffer 700 comprises two PMOS transistors 731 and 732, two NMOS transistors 733 and 734, and four optional resistors 741, 742, 743, and 744. If a desired duty cycle change requires $Y_3$ to have a pull-up weaker than a pull-down in response to a toggle of $X_3$, resistors 742 and 743 are helpful and can be incorporated, while resistors 741 and 742 are detrimental and should be avoided (i.e., replaced by a short circuit). If a desired duty cycle change requires $Y_3$ to have a pull-down weaker than a pull-up in response to a toggle of $X_3$, resistors 741 and 744 are helpful and can be incorporated, while resistors 742 and 743 are detrimental and should be avoided (i.e., replaced by a short circuit).

Now refer to FIG. 4. In the appended claims, UCM 411 (412, 413) is said to be a succeeding UCM of UCM 410 (411, 412), while UCM 410 (411, 412) is said to be a preceding UCM of UCM 411 (412, 413).

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A duty-cycle adjustment circuit comprising:
   a conditional inversion circuit configured to receive an input clock and output a conditionally inverted clock in accordance with an inversion enable signal; and
   a one-directional duty adjustment circuit comprising an uneven clock buffer and an uneven clock multiplexer (UCM) chain comprising NUCMs, where N is an integer greater than 1, that are cascaded and controlled by a N-bit control code, wherein each of said NUCMs receives a respective first input from either the conditional inversion circuit or a respective preceding UCM, and a respective second input from either a respective succeeding UCM or the uneven clock buffer, and outputs a respective first output to either a respective succeeding UCM or the uneven clock buffer, and a respective second output either as an output clock or to a respective preceding UCM, in accordance with a respective bit of the N-bit control code.

2. The duty-cycle adjustment circuit of claim 1, wherein the one-directional duty adjustment circuit is a duty enlarging circuit such that a duty cycle of the output clock is larger than a duty cycle of the conditionally inverted clock regardless of a value of the N-bit control code.

3. The duty-cycle adjustment circuit of claim 1, wherein the one-directional duty adjustment circuit is a duty reducing circuit such that a duty cycle of the output clock is smaller than a duty cycle of the conditionally inverted clock regardless of a value of the N-bit control code.

4. The duty-cycle adjustment circuit of claim 1 further comprising an encoder configured to encode an integer, which is not smaller than zero but not greater than N, into the N-bit control code.

5. The duty-cycle adjustment circuit of claim 4, wherein the encoder is a thermometer code encoder, wherein an increment of the integer leads to an additional bit of the N-bit control code being set to 1.

6. The duty-cycle adjustment circuit of claim 1, wherein: each of said N UCMs is instantiated from a UCM circuit that receives a first input and a second input from a first input pin and a second input pin, respectively, and outputs a first output and a second output via a first output pin and second output pin, respectively, in accordance with a control signal provided at a control pin.

7. The duty-cycle adjustment circuit of claim 6, wherein: if the control signal is 0, the first input propagates into the second output with a duty cycle change of a first amount; else, the first input propagates into the first output with a duty cycle change of a second amount, and the second input propagates into the second output with a duty cycle change of a third amount.

8. The duty-cycle adjustment circuit of claim 7, wherein the UCM comprises: an inverter configured to receive the control signal and output an inverted control signal: a first NAND gate configured to receive the control signal and the first input and output the first output; a second NAND gate configured to receive the inverted control signal and the first input and output an inverted input; and a third NAND gate configured to receive the inverted input and the second input and output the second output.

9. The duty-cycle adjustment circuit of claim 8, wherein each of the first NAND gate, the second NAND gate, and the third NAND gate includes a resistor incorporated to weaken either a pull-up or a pull-down.

10. The duty-cycle adjustment circuit of claim 8, wherein each of the first NAND gate, the second NAND gate, and the third NAND gate comprises a PMOS (p-channel metal oxide semiconductor) transistor and a NMOS (p-channel metal oxide semiconductor) transistor, wherein a pull-up strength of the PMOS transistor is different from a pull-down strength of the NMOS transistor.

11. The duty-cycle adjustment circuit of claim 1, wherein the uneven clock buffer comprises two inverters that are cascaded.

12. The duty-cycle adjustment circuit of claim 11, wherein at least one of the two inverters comprises a resistor that incorporated to weaken either a pull-up or a pull-down.

13. The duty-cycle adjustment circuit of claim 11, wherein at least one of the two inverters comprises a PMOS (p-channel metal oxide semiconductor) transistor and a NMOS (p-channel metal oxide semiconductor) transistor, wherein a pull-up strength of the PMOS transistor is different from a pull-down strength of the NMOS transistor.

14. A method of duty cycle adjustment comprising:
conditionally inverting an input clock into a conditionally inverted clock; and
adjusting a duty cycle of the conditionally inverted clock in one direction in accordance with an integer that represents an amount of duty cycle adjustment,
wherein adjusting the duty cycle of the conditionally inverted clock in one direction in accordance with the integer that represents the amount of duty cycle adjustment comprises using a one-directional duty adjustment circuit that comprises an uneven clock buffer and a plurality of uneven clock multiplexers (UCMs) that are cascaded and incrementally activated as a value of the integer increments.

15. The method of duty cycle adjustment of claim 14 further comprising encoding the integer into a plurality of control signals to control said plurality of uneven clock multiplexers, respectively.

16. The method of duty cycle adjustment of claim 15, wherein encoding the integer into said plurality of control signals comprises using a thermometer code encoder.

17. The method of duty cycle adjustment of claim 15, wherein each of said plurality of UCMs receives a respective first input either from the conditionally inverted clock or a respective preceding UCM, and a respective second input from either a respective succeeding UCM or the uneven clock buffer, and outputs a respective first output to either a respective succeeding UCM or the uneven clock buffer, and a respective second output either as an output clock or to a respective preceding UCM, in accordance with a respective control signal among said plurality of control signals.

18. The method of duty cycle adjustment of claim 17, wherein: each of said plurality of UCMs is instantiated from a UCM circuit that receives a first input and a second input from a first input pin and a second input pin, respectively, and outputs a first output and a second output via a first output pin and second output pin, respectively, in accordance with a control signal provided at a control pin.

19. The method of duty cycle adjustment of claim 18, wherein: if the control signal is 0, the first input propagates into the second output with a duty cycle change of a first amount; else, the first input propagates into the first output with a duty cycle change of a second amount, and the second input propagates into the second output with a duty cycle change of a third amount.

* * * * *